US006563363B1

(12) United States Patent
Tay

(10) Patent No.: US 6,563,363 B1
(45) Date of Patent: May 13, 2003

(54) SWITCHED CAPACITOR COMPARATOR NETWORK

(75) Inventor: Hiok-Nam Tay, Irvine, CA (US)

(73) Assignee: Pictos Technologies, Inc., Newport Beach, CA (US)

( * ) Notice: Subject to any disclaimer, the term of this patent is extended or adjusted under 35 U.S.C. 154(b) by 0 days.

(21) Appl. No.: 10/004,909

(22) Filed: Nov. 2, 2001

(Under 37 CFR 1.47)

(51) Int. Cl.[7] .............................. G06G 7/64; H03K 5/22
(52) U.S. Cl. .............................. 327/337; 327/77; 330/9
(58) Field of Search .......................... 327/337, 554, 327/96, 94, 77; 330/9, 51

(56) References Cited

U.S. PATENT DOCUMENTS

| 5,410,270 A | * | 4/1995 | Rybicki et al. ............... 330/9 |
| 5,751,189 A | * | 5/1998 | Shyu et al. .................... 330/9 |
| 6,140,950 A | * | 10/2000 | Oprescu ....................... 341/125 |
| 6,445,331 B1 | * | 9/2002 | Stegers ........................ 327/337 |

* cited by examiner

Primary Examiner—Toan Tran
(74) Attorney, Agent, or Firm—Sonnenschein Nath & Rosenthal

(57) ABSTRACT

A comparator network includes a comparator and a switched capacitor front end coupled to the comparator. The switched capacitor front end includes an input signal sampling capacitance, a reference signal sampling capacitance, and a switch network for coupling the input signal sampling capacitance and the reference signal sampling capacitance between a sampling configuration and a charge sharing configuration. The input signal sampling capacitance is realized with first and second differential input sampling capacitors, and the reference signal sampling capacitance is realized with first and second differential reference signal capacitors. Clocks change the switched capacitor front end between the sampling configuration and the charge sharing configuration. The comparator network is set at a preselected voltage threshold by setting a ratio of the reference sampling capacitance to the input sampling capacitance equal to a ratio of the preselected threshold voltage to a reference voltage. The comparator network performs signal comparison using less power and fewer references voltages, while eliminating cross-coupling among multiple comparators, than conventional comparator network implementations.

27 Claims, 5 Drawing Sheets

SWITCHED CAPACITOR COMPARATOR NETWORK

BACKGROUND OF THE INVENTION

1. Field of the Invention

This invention relates to electronic circuitry for performing a comparison on an input signal, and in particular to a switched capacitor comparator network that performs charge sharing as an aid in making the comparison.

2. Related Art

Comparators are common electronic building blocks that find use in a wide range of applications, including analog to digital converters (ADCs). For example, in a flash ADC, a resistor string with multiple taps (or multiple single tap resistor strings), sets a unique threshold voltage at each tap. Each tap is connected to a comparator for determining whether the input voltage exceeds the threshold voltage.

Generally, two low impedance DC reference voltage sources are required to drive the start and the end of the resistor string. For high-speed comparator operation, the resistor values need to be small to reduce the settling time of kickback transients that arise when the comparators are simultaneously switched into the comparison phase. While resistive tap flash ADCs have certain advantages, they also suffer from certain drawbacks.

In particular, resistive tap ADCs require two reference voltages. Both reference voltages need to be low impedance, and, as a result, a large off-chip capacitor is generally required. The off-chip capacitor often requires the ADC chip to include extra connection pins, uses additional circuit board space, and also increases component cost. In addition, because the resistive taps draw DC current, they consume relatively large amounts of power. For high speed ADCs, where the resistor values are quite small, the power consumption is particularly high. Furthermore, some degree of cross-coupling occurs between multiple comparators through shared reference voltages.

A need exists for an improved comparator network that addresses the problems noted above and other previously experienced.

SUMMARY

An improved comparator network is arrived at by implementing a charge sharing switched capacitor front end coupled to a comparator. The comparator network may be broadly conceptualized as a charge sharing comparator network that performs signal comparison using less power and fewer references voltages, while eliminating cross-coupling among multiple comparators, than conventional comparator network implementations.

An implementation of the comparator network includes a comparator and a switched capacitor front end coupled to the comparator. The switched capacitor front end includes an input signal sampling capacitance, a reference signal sampling capacitance, and a switch network for coupling the input signal sampling capacitance and the reference signal sampling capacitance between a sampling configuration and a charge sharing configuration.

Preferably, the input signal sampling capacitance is realized with first and second differential input sampling capacitors, and the reference signal sampling capacitance is realized with first and second differential reference signal capacitors. Clocks change the switched capacitor front end between the sampling configuration and the charge sharing configuration. The comparator network is set at a preselected voltage threshold by setting a ratio of the reference sampling capacitance to the input sampling capacitance equal to a ratio of the preselected threshold voltage to a reference voltage:

(Cref/Cin)=(Vth/Vref), or Vth=Vref*(Cref/Cin).

Thus, numerous comparator networks with individually set voltage thresholds may be cascaded to form a signal comparison network such as an ADC.

Other implementations, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principals of the invention. Moreover, in the figures, like reference numerals designate corresponding parts throughout the different views.

DETAILED DESCRIPTION

Figure 1:
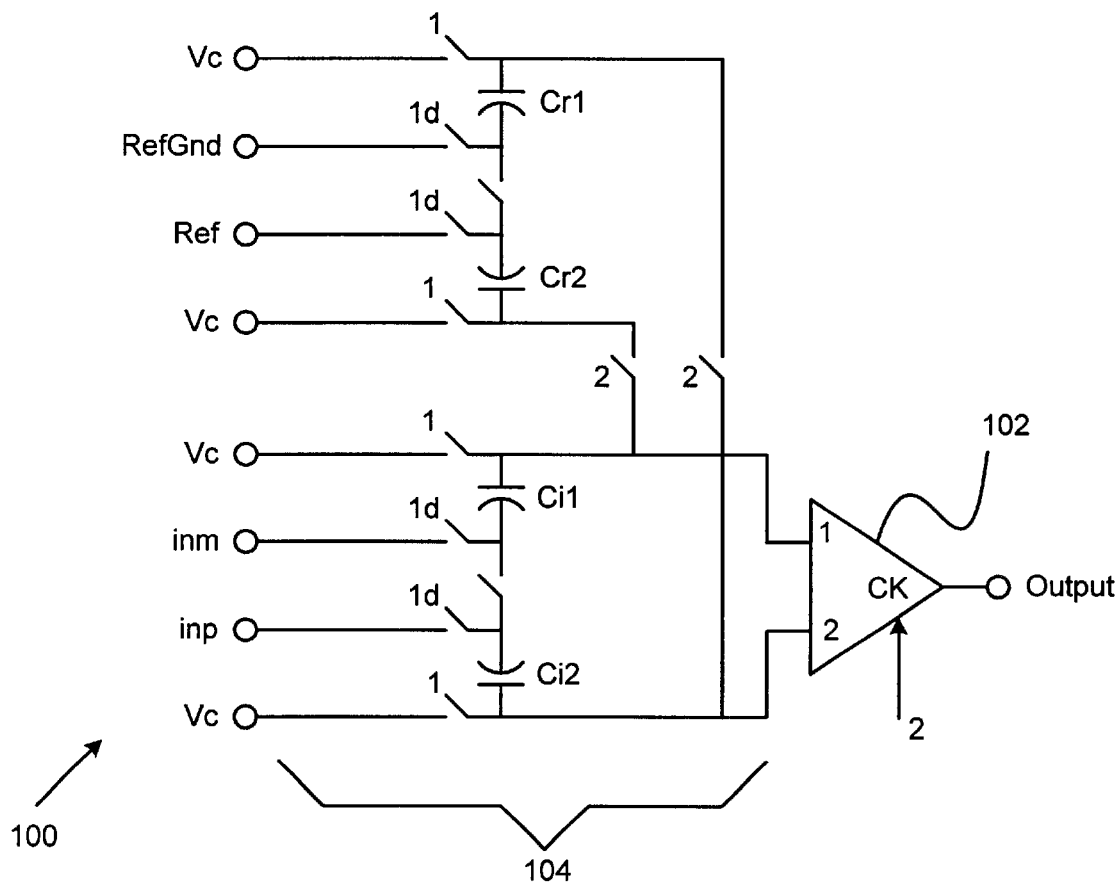
FIG. 1 illustrates a switched capacitor comparison network.

With regard first to FIG. 1, that figure illustrates a switched capacitor comparison network 100 ("network 100"). Although not required in every implementation, the network 100 is configured to accept a differential input signal (inp, inm) and a differential reference signal (Ref, RefGnd). In situations where single ended signals exist, the single ended signals are preferably first converted to differential form.

The network 100 includes a comparator 102, and a switched capacitor front end 104 coupled to the comparator 102. The switched capacitor front end 104 includes an input signal sampling capacitance differentially formed from capacitors Ci1 and Ci2, a reference signal sampling capacitance differentially formed from capacitors Cr1 and Cr2, and a switch network. The switch network includes the switches labeled 1, 1d, and 2, where the labels denote a clock that controls each switch. The switches will be referred to below as 1-switches, 1d-switches, and 2-switches in accordance with their labels.

As will be explained below, the switch network 110 includes the switches that couple the input signal sampling capacitance and the reference signal sampling capacitance between a sampling configuration and a charge sharing configuration. The 2-switches are charge sharing switches, the 1- and 1d-switches connected to Cr1 and Cr2 are reference sampling switches, and the 1- and 1d-swithces connected to Ci1 and Ci2 are input signal sampling switches.

In FIG. 1, the capacitors are drawn with one plate indicated by a straight line and another plate indicated by a curved line. The straight line indicates the top plate of a capacitor implemented on a semiconductor substrate. The top plate is shielded from the bottom plate, and from the relatively noisy substrate. The capacitances may range in value depending on the application, but when formed in a semiconductor substrate may be on the order of a few tenths of a femtofarad (fF). The switches shown in FIG. 1 may be implemented as NFET switches and the like, and the comparator 102 may be implemented as a clocked comparator.

Note also that a comparator biasing voltage, Vc, is supplied to the network 100. The comparator biasing voltage Vc sets the operating point for the network 100 to be within the operating range of the comparator 102. Typically, Vc is halfway between a power supply voltage and ground.

Figure 2:
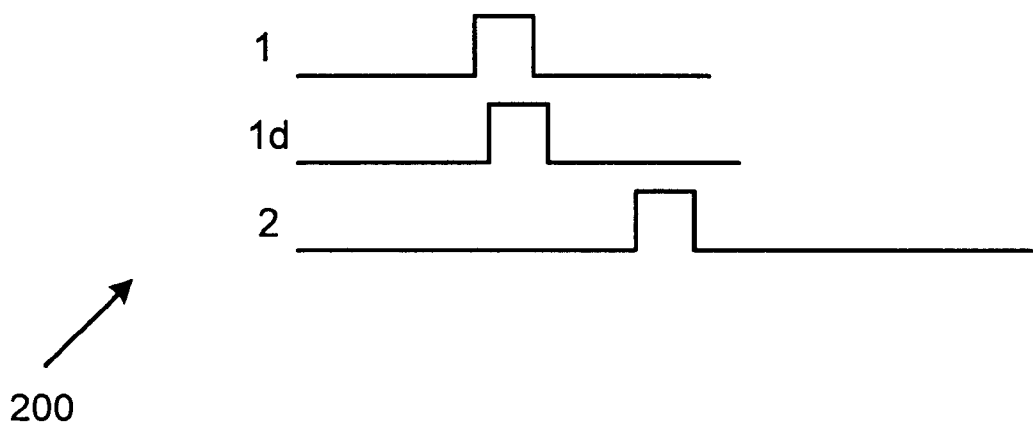
FIG. 2 shows two sampling clocks and a comparison clock.

The network 100 changes between a sampling configuration and a charge sharing configuration under control of the clocks shown in FIG. 2. Clocks 1 and 1d are sampling clocks, while clock 2 is a charge sharing clock. Clock 1d is a version of clock 1 delayed by a time delay. The time delay has a duration that ensures that the 1 switches close before the 1-d switches. The time delay is typically less than 5 ns (e.g., approximately 1 ns).

Figure 3:
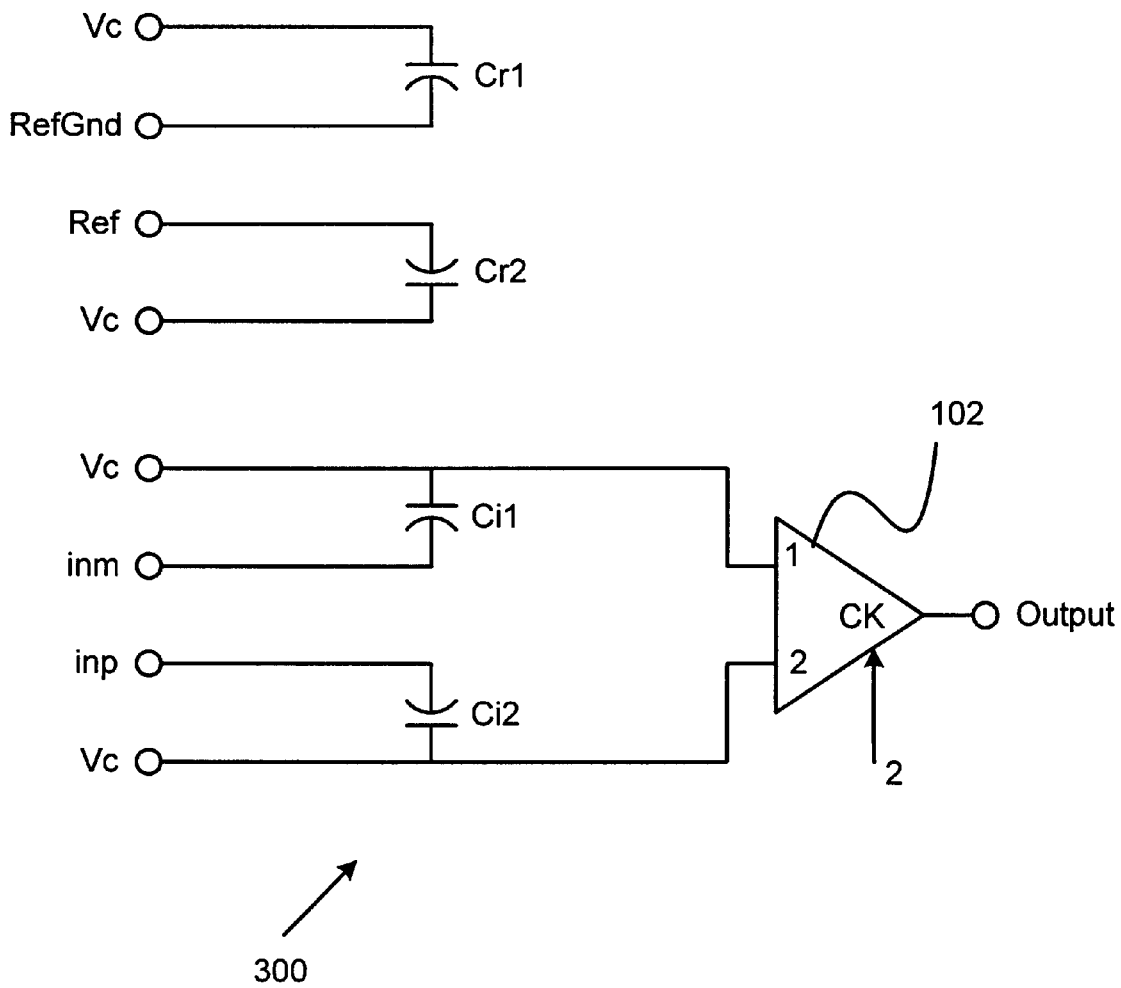
FIG. 3 shows an input signal and reference signal sampling configuration.

Turning next to FIG. 3, that figure shows the network 100 in the sampling configuration 300. The network 100 operates in the sampling configuration 300 during the time that the clocks 1 and 1d hold closed the sampling switches. The charge sharing are open. Note that in the sampling configuration 300, the input signal sampling capacitance differentially samples the input signal (inp, inm), while the reference signal sampling capacitance differentially samples the reference signal (Ref, RefGnd).

Figure 4:
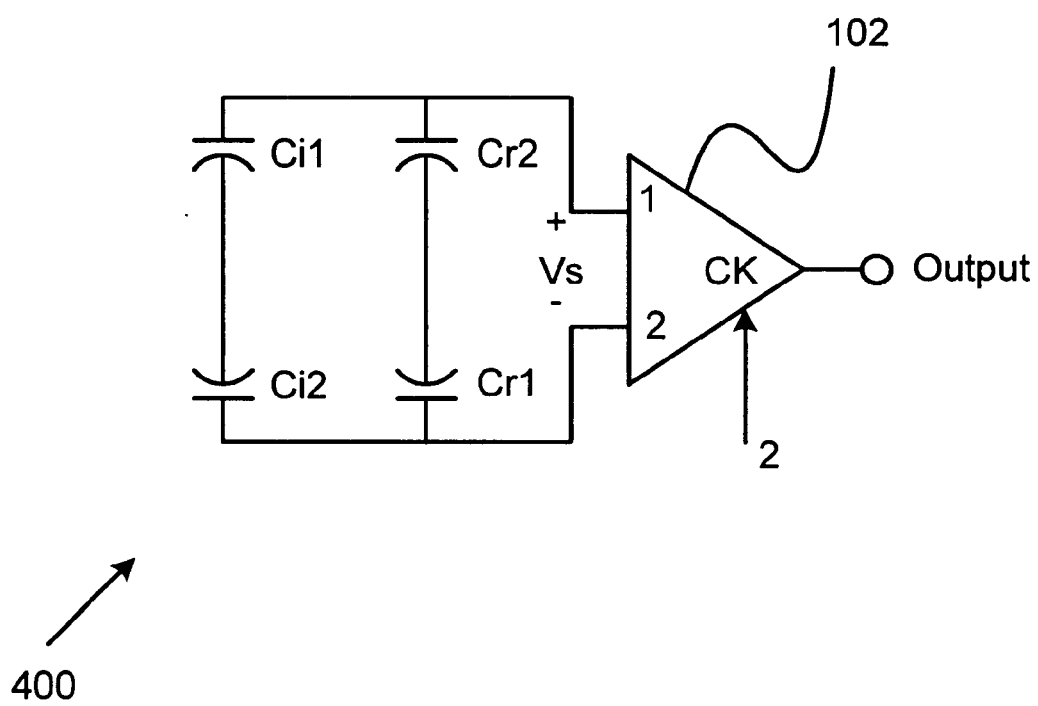
FIG. 4 illustrates a charge sharing configuration.

When the clocks 1 and 1d no longer hold closed the sampling switches (i.e., after a preselected sampling period), the network 100 enters the charge sharing configuration 400 shown in FIG. 4 when clock 2 closes the charge sharing switches. The charge sharing configuration 400 places the input signal sampling capacitance in parallel with the reference signal sampling capacitance to facilitate charge sharing between the input signal sampling capacitance and the reference signal sampling capacitance. A resultant voltage Vs is obtained at the input to the comparator 102.

For purposes of discussion below, it will be assumed that Cr1=Cr2=Cref, Ci1=Ci2=Cin, and that Vin=the differential input voltage. Ignoring the biasing effect of Vc, the resultant voltage Vs equals the total charge divided by the total capacitance:

$$Vs=(Cin*Vin-Cref*(Vref-VrefGnd))/(Cin+Cref).$$

The output of the comparator 102 changes states depending on whether its input, Vs, is positive or negative. The zero voltage cross over point is at Vs=0 or:

Cin*Vin=Cref*(Vref−VrefGnd).

Expressed another way:

(Cref/Cin)=(Vin/(Vref−VrefGnd)).

In many instances, VrefGnd is approximately zero and therefore:

(Cref/Cin)=(Vin/Vref).

Thus, the input voltage at which the comparator changes states (i.e., the threshold voltage Vth) is given by:

Vth=Vref*(Cref/Cin).

As Vin exceeds Vth, Vs becomes more positive, while as Vin falls below Vth, Vs becomes negative.

By adjusting Vref, VrefGnd, Cref, or Cin the network 100 may be set to a desired preselected voltage threshold. Providing two or more networks 100, each with individually set voltage thresholds thereby implements a signal comparison network which may be tailored for operation, for example, as an ADC. In an ADC implementation, the voltage thresholds would be set in accordance with a desired number of output bits and resultant quantization steps in much the same manner as a flash ADC using a resistive tap implementation.

Figure 5:
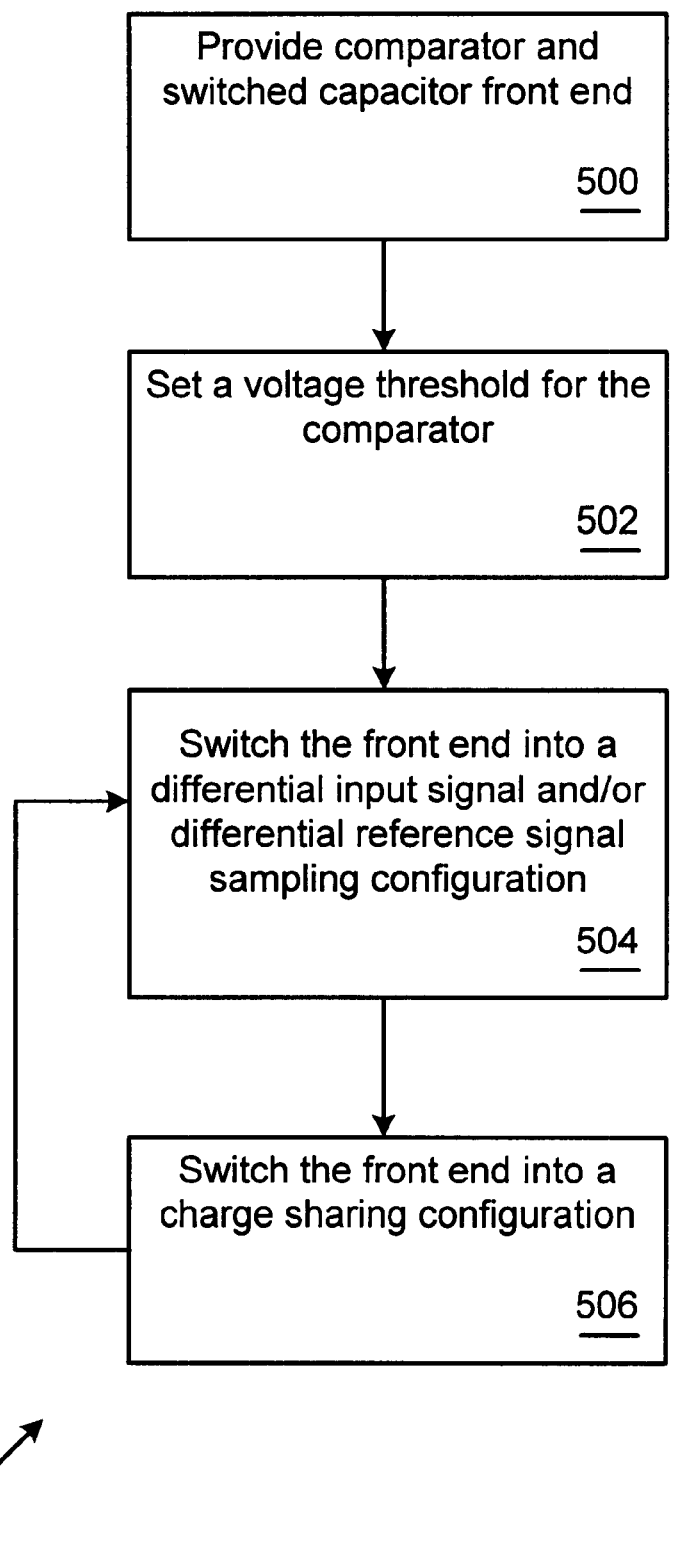
FIG. 5 shows a method for signal comparison.

Turning next to FIG. 5, that figure illustrates a method 500 for performing a signal comparison as discussed in detail above. First, a comparator 102 and switched capacitor front end 104 are provided (502). A voltage threshold for the comparator is selected and set (504). As noted above, the voltage threshold may be set by adjusting Vref, Cref, or Cin. The input signal and reference voltage are sampled, preferably differentially, when the front end is switched (506) in the sampling configuration. Charge sharing occurs when the front end is subsequently switched (508) into the charge sharing configuration. The comparator 102 output then indicates whether the input voltage exceeds or does not exceed the voltage threshold.

Thus, the network 100 provides a signal comparison function without the excessive power dissipation of tapped resistor strings. In addition, the network 100 uses a single reference voltage Vref, and eliminates cross-coupling among multiple comparators.

While various embodiments of the application have been described, it will be apparent to those of ordinary skill in the art that many more embodiments and implementations (e.g., using a different form or representation of quantization of the photoreceptor noise range) are possible that are within the scope of this invention. Accordingly, the invention is not to be restricted except in light of the attached claims and their equivalents.

What is claimed is:

1. A switched capacitor comparator network comprising:
   a comparator; and
   a switched capacitor front end coupled to the comparator, the switched capacitor front end comprising:
      an input signal sampling capacitance;
      a reference signal sampling capacitance; and
      a switch network for coupling the input signal sampling capacitance and the reference signal sampling capacitance between a sampling configuration and a charge sharing configuration.

2. The comparator network of claim 1, wherein the input signal sampling capacitance comprises first and second differential input sampling capacitors.

3. The comparator network of claim 1, wherein the reference signal sampling capacitance comprises first and second differential reference signal capacitors.

4. The comparator network of claim 1, wherein the sampling configuration comprises a first input signal sampling switch clocked with a sampling clock, and a second input signal sampling switch clocked with the sampling clock delayed by a time interval.

5. The comparator network of claim 4, wherein the time interval is less then 5 ns.

6. The comparator network of claim 1, wherein the sampling configuration comprises a first reference sampling switch clocked with a sampling clock, and a second reference sampling switch clocked with the sampling clock delayed by a time interval.

7. The comparator network of claim 6, wherein the time interval is less then 5 ns.

8. The comparator network of claim 1, wherein the charge sharing configuration comprises a charge sharing switch clocked with a comparison clock.

9. The comparator network of claim 8, wherein the comparator is a clocked comparator that is clocked by the comparison clock.

10. The comparator network of claim 1, wherein the comparator network is set at a preselected voltage threshold by setting a ratio of the reference sampling capacitance to the input sampling capacitance equal to a ratio of the preselected threshold voltage to a reference voltage.

11. A signal comparison network comprising:
a plurality of switched capacitor comparator networks, each comprising:
a comparator; and
a switched capacitor front end coupled to the comparator, the switched capacitor front end comprising:
an input signal sampling capacitance;
a reference signal sampling capacitance; and
a switch network for coupling the input signal sampling capacitance and the reference signal sampling capacitance between a sampling configuration and a charge sharing configuration,
wherein each switched capacitor comparator network is set to a preselected voltage threshold.

12. The signal comparison network of claim 11, wherein each preselected voltage threshold is established by setting a ratio of the reference sampling capacitance to the input sampling capacitance equal to a ratio of each preselected threshold voltage to a reference voltage, for each switched capacitor comparator network.

13. The signal comparison network of claim 11, wherein, for at least one of the plurality of switched capacitor comparator networks, the input signal sampling capacitance comprises first and second differential input sampling capacitors.

14. The signal comparison network of claim 11, wherein, for at least one of the plurality of switched capacitor comparator networks, the reference signal sampling capacitance comprises first and second differential reference signal capacitors.

15. A method for signal comparison, the method comprising:
providing a comparator coupled to a switched capacitor front end, the switched capacitor front end comprising:
an input signal sampling capacitance; and
a reference signal sampling capacitance;
switching the front end into a sampling configuration to sample an input signal and a reference signal; and
switching the front end into a charge sharing configuration to share charge between the input signal capacitance and the reference signal capacitance.

16. The method of claim 15, wherein switching into the sampling configuration comprises switching into a differential input sampling configuration.

17. The method of claim 15, wherein switching into the charge sampling configuration comprises switching into a differential reference signal sampling configuration.

18. The method of claim 15, wherein switching into the sampling configuration comprises switching a first switch in accordance with a sampling clock, and switching a second switch in accordance with the sampling clock delayed by a time interval.

19. The method of claim 18, wherein the first and second switches are input signal sampling switches.

20. The method of claim 18, wherein the first and second switches are reference signal sampling switches.

21. The method of claim 15, wherein the comparator is characterized by a preselected voltage threshold set according to a ratio of the reference sampling capacitance to the input sampling capacitance equal to a ratio of the preselected threshold voltage to a reference voltage.

22. A switched capacitor comparator network comprising:
means for comparing an input signal;
means for sampling an input signal and a reference voltage; and
means for switching the means for sampling between a sampling configuration and a charge sharing configuration.

23. The comparator network of claim 22, wherein the means for sampling comprises means for capacitive sampling.

24. The comparator network of claim 22, wherein the means for sampling comprises means for differential sampling of at least one of the input signal and the reference voltage.

25. The comparator network of claim 22, further comprising means for clocking the means for switching into the sampling configuration.

26. The comparator network of claim 22, further comprising means for clocking the means for switching into the charge sharing configuration.

27. The comparator network of claim 22, wherein the comparator network is set at a preselected voltage threshold by setting a ratio of a reference sampling capacitance to an input sampling capacitance equal to a ratio of the preselected threshold voltage to the reference voltage.

* * * * *